(12) United States Patent
Lu et al.

(10) Patent No.: US 11,098,403 B2
(45) Date of Patent: Aug. 24, 2021

(54) HIGH ENTROPY ALLOY THIN FILM COATING AND METHOD FOR PREPARING THE SAME

(71) Applicant: City University of Hong Kong, Kowloon (HK)

(72) Inventors: Yang Lu, New Territories (HK); Weibing Liao, Kowloon (HK)

(73) Assignee: City University of Hong Kong, Kowloon (HK)

( * ) Notice: Subject to any disclaimer, the term of this patent is extended or adjusted under 35 U.S.C. 154(b) by 672 days.

(21) Appl. No.: 15/426,164

(22) Filed: Feb. 7, 2017

(65) Prior Publication Data

US 2018/0223417 A1    Aug. 9, 2018

(51) Int. Cl.
| | | |
|---|---|---|
| *C23C 14/34* | (2006.01) | |
| *C23C 14/16* | (2006.01) | |
| *C23C 14/35* | (2006.01) | |
| *C23C 14/50* | (2006.01) | |
| *C22C 30/00* | (2006.01) | |
| *B22D 25/00* | (2006.01) | |

(52) U.S. Cl.
CPC .......... *C23C 14/3414* (2013.01); *B22D 25/00* (2013.01); *C22C 30/00* (2013.01); *C23C 14/165* (2013.01); *C23C 14/35* (2013.01); *C23C 14/505* (2013.01)

(58) Field of Classification Search
CPC .......................... C23C 14/3414; C23C 14/165
See application file for complete search history.

(56) References Cited

U.S. PATENT DOCUMENTS

| | | | | |
|---|---|---|---|---|
| 4,395,465 A | * | 7/1983 | Takagi ................... | G11B 5/851 204/192.2 |
| 4,401,539 A | * | 8/1983 | Abe ..................... | H01J 37/3408 204/192.1 |
| 5,346,600 A | * | 9/1994 | Nieh ................... | C23C 14/0036 204/192.3 |
| 5,370,778 A | * | 12/1994 | Koo .................... | C23C 14/0057 204/192.15 |
| 6,086,725 A | * | 7/2000 | Abburi ............... | C23C 14/3414 204/192.1 |
| 2002/0051852 A1 | * | 5/2002 | Zywitzki ............... | C04B 41/009 427/585 |
| 2007/0045102 A1 | * | 3/2007 | Lee ....................... | C23C 14/165 204/192.2 |

(Continued)

OTHER PUBLICATIONS

Lin, "Multi-component nitride coatings derived from Ti—Al—Cr—Si—V target in Rf magnetron sputter". Surface & Coatings Technology 201 (2007) 6304-6308. (Year: 2007).*

(Continued)

*Primary Examiner* — Jason Berman
(74) *Attorney, Agent, or Firm* — Renner Kenner Greive Bobak Taylor & Weber

(57) ABSTRACT

A method for preparing a high entropy alloy thin film coating includes preparing a melt alloy by arc melting raw materials including five or more elements, casting the melt alloy into a mold to form a target, placing the target inside a vacuum chamber of a magnetron sputtering system, and rotatably fixing a substrate inside the vacuum chamber, spaced apart from the target. A high entropy alloy thin film is deposited on the substrate by high vacuum radio frequency sputtering inside the vacuum chamber.

21 Claims, 3 Drawing Sheets

(56) References Cited

U.S. PATENT DOCUMENTS

| | | | | |
|---|---|---|---|---|
| 2009/0301610 A1* | 12/2009 | Gillon | ............... | C23C 14/027 148/403 |
| 2012/0148866 A1* | 6/2012 | Chang | ............... | C23C 14/027 428/627 |
| 2013/0048489 A1* | 2/2013 | Yamaguchi | ......... | C23C 14/0068 204/192.15 |
| 2014/0346038 A1* | 11/2014 | Shin | ................ | C22C 16/00 204/298.13 |

OTHER PUBLICATIONS

S. G. Ma, S. F. Zhang, J. W. Qiao, Z. H. Wang, M. C. Gao, Z. M. Jiao, H. J. Yang and Y. Zhang, "Superior high tensile elongation of a single-crystal CoCrFeNiAl0.3 high-entropy alloy by Bridgman solidification", Intermetallics, No. 54, pp. 104-109, 2014.

L. Tian, Z. M. Jiao, G. Z. Yuan, S. G. Ma, Z. H. Wang, H. J. Yang, Y. Zhang and J. W. Qiao, "Effect of strain rate on deformation behavior of AlCoCrFeNi high-entropy alloy by nanoindentation", Journal of materials engineering and performance, No. 25, pp. 2255-2260, 2016.

W. Sheng, X. Yang, C. Wang and Y. Zhang, "Nano-crystallization of high-entropy amorphous NbTiAlSiWxNy films prepared by magnetron sputtering", Entropy, No. 18, vol. 226, pp. 1-7, 2016.

B.R. Braeckman and D. Depla, "Structure formation and properties of sputter deposited NbxCoCrCuFeNi high entropy alloy thin films", Journal of alloys and compounds (2015), doi: 10.1016/j.jallcom.2015.06.097.

B.R. Braeckma, F. Boydens, H. Hidalgo, P. Dutheil, M. Jullien, A-L. Thomann and D. Depla, "High entropy alloy thin films deposited by magnetron sputtering of powder targets", Thin Solid Films (2015), doi:10.1016/j.tsf.2015.02.070.

W. Guo, W. Dmowski, J.Y. Noh, P. Rack, P.K. Liaw and T. Egami, "Local atomic structure of a high entropy alloy: an X-ray and neutron scattering study", Metallurgical and materials transactions A, No. 44A, pp. 1994-1997, 2013.

H. Zhang, K.W. Sui, W. Liao, Q. Wang, Y. Yang and Y. Lu, "In situ mechanical characterization of CoCrCuFeNi high-entropy alloy micro/nano-pillars for their size-dependent mechanical behavior", Materials research express, No. 3, vol. 094002, pp. 1-9, 2016.

* cited by examiner

HIGH ENTROPY ALLOY THIN FILM COATING AND METHOD FOR PREPARING THE SAME

FIELD OF INVENTION

The invention relates to a high entropy alloy thin film coating and a method for preparing the same.

BACKGROUND

High Entropy Alloys (HEAs) are a new kind of alloy typically composed of five or more elements with near equi-atomic ratio and no principal/dominant element.

They have recently attracted tremendous attention due to their excellent mechanical and physical properties, such as fracture resistance, high ductility at cryogenic temperature, and excellent corrosion and wear resistance.

Such alloys, however, reveal relatively simple crystal structures in terms of a solid solution, rather than intermetallics formed in the alloys, such as a face center cubic (fcc) structure, a body center cubic (bcc) structure, or a mixture of fcc and bcc solid solutions, and thus a series of unique properties are found.

Typically, HEAs are prepared by complicated metallurgy methods, in which the raw materials are melted at high temperature to keep the alloy homogeneous, and cooled down to form bulk HEAs. However, the multiple elements used in the bulk size alloys increase the cost for many industrial applications that do not need large volumes of HEAs.

An aim of the invention therefore is to provide a method for coating a component with a HEA directly to confer the advantageous effects of the HEA thereon without requiring large volumes of the HEA.

SUMMARY OF INVENTION

In an aspect of the invention, there is provided a method for preparing a high entropy alloy thin film coating comprising the steps of:
preparing a melt alloy by arc melting raw materials comprising five or more elements;
casting the melt alloy into a mold to form a target;
placing the target inside a vacuum chamber of a magnetron sputtering system;
rotatably fixing a substrate inside the vacuum chamber, spaced apart from the target;
characterised in that a high entropy alloy thin film is deposited on the substrate by high vacuum radio frequency sputtering inside the vacuum chamber.

Advantageously, the invention allows a HEA thin film (with thickness ranging from hundreds of nanometres to tens of microns) over the surface of a substrate such as a component to enhance the component's wear resistance and hardness. The thin films not only have the excellent mechanical properties provided by the HEAs, but also reduce the cost of using large amount of HEA materials in industrial applications. Furthermore, the magnetic sputtering-based technique provides an efficient way to prepare high quality coating of HEA thin films over components with complicated geometries/surfaces.

In one embodiment the raw materials are Cobalt, Chromium, Iron, Nickel and Aluminium, although it will be appreciated that combinations of other elements may be used. For example Manganese could be substituted for Aluminium. Typically the raw materials have a high purity of >99.99%.

In one embodiment the raw materials are provided in approximately equal atomic ratios. In an alternative embodiment Cobalt, Chromium, Iron, Nickel and Aluminium are provided in the atomic ratios of 1:1:1:1:0.3. In a further embodiment each raw material is provided in the atomic proportion of 5-35% of the total.

In one embodiment the mold is made of copper, although it will be appreciated that any suitable material could be used.

In one embodiment the target is machined to ensure it has a smooth surface and accurate dimensions.

In one embodiment the target is fixed to the vacuum chamber via a target holder.

In one embodiment the substrate is silicon, although it will be appreciated that any suitable material could be used.

In one embodiment the substrate is ultrasonically cleaned and rinsed with acetone, ethanol and deionized water, typically for around 15 minutes each, before putting it in the vacuum chamber.

In one embodiment an inert gas such as argon is added into the vacuum chamber when the base pressure is less than 1 µPa. Typically the argon has a purity of at least 99.995%.

In one embodiment the ignition argon flow is set to be around 20-22 standard cubic centimetres per minute (sccm).

In one embodiment the target is cleaned by argon ion bombardment for at least two minutes to remove any oxide or contaminants on the surface.

In one embodiment a radio frequency power supply is connected to at least one target holder inside the vacuum chamber. Typically the radio frequency power is around 500 W.

In one embodiment the film is deposited on the substrate in an atmosphere of argon at room temperature. Typically the argon flow rate after ignition is around 12 sccm. Typically the specific working distance between the substrate and the target is around 80 mm.

In one embodiment the rotation speed of the substrate is set at around 2 revolutions per minute to ensure homogeneous deposition. Advantageously this causes the HEA film to have a nanocrystalline structure instead of a random film structure.

In one embodiment power was set at around 500 W for every deposition. Typically the power was controlled by a computer which could adjust the voltage and current as required.

In one embodiment various thickness thin films were obtained with different deposition times. Typically the deposition rate was around 500-1500 µm per hour.

In a further aspect of the invention there is provided a method for preparing a high entropy alloy thin film coating comprising the steps of:
preparing a melt alloy by arc melting Cobalt, Chromium, Iron, Nickel and Aluminium, each having a purity of >99.99%, in the atomic ratios of 1:1:1:1:0.3;
casting the melt alloy into a copper mold to form a target;
fixing the target to a target holder inside a vacuum chamber of a magnetron sputtering system;
preparing a silicon substrate by ultrasonic cleaning, and rinsed with acetone, ethanol and deionized water for 15 minutes each;
rotatably fixing the substrate inside the vacuum chamber, spaced apart from the target;
reducing the pressure inside the vacuum chamber to less than 1 µPa;

flowing argon into the vacuum chamber;
cleaning the target by argon ion bombardment for at least two minutes;
characterised in that a high entropy alloy thin film is deposited on the substrate by high vacuum radio frequency sputtering inside the vacuum chamber.

In a still further aspect of the invention there is provided a high entropy alloy thin film coating prepared according to the method described herein.

In one embodiment the high entropy alloy thin film has a face centre cubic structure.

In one embodiment the elastic modulus is at least 150 GPa, typically around 190 GPa.

In one embodiment the hardness is at least 10 GPa, typically around 11 GPa.

In a yet further aspect of the invention there is provided a component coated with a high entropy alloy thin film coating prepared according to the method described herein.

BRIEF DESCRIPTION OF DRAWINGS

It will be convenient to further describe the present invention with respect to the accompanying drawings that illustrate possible arrangements of the invention. Other arrangements of the invention are possible, and consequently the particularity of the accompanying drawings is not to be understood as superseding the generality of the preceding description of the invention.

DETAILED DESCRIPTION

Figure 1:
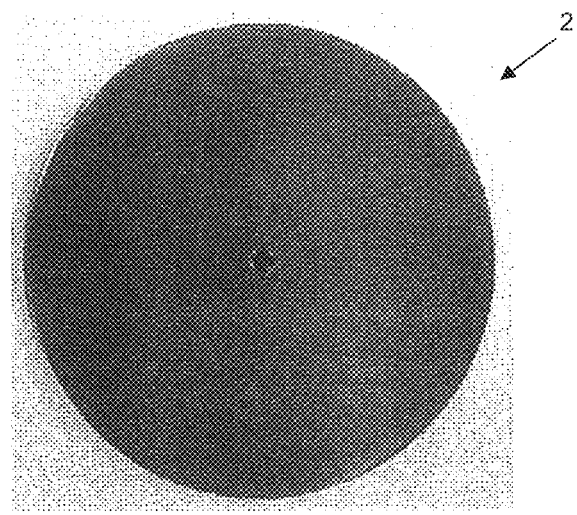
FIG. 1 illustrates the morphology of a target utilised in an embodiment of the invention.

With regard to FIG. 1, the target was prepared by arc-melting raw materials with high purity (>99.99%). The raw materials in this example were Cobalt, Chromium, Iron, Nickel and Aluminium provided in the atomic ratios of 1:1:1:1:0.3. The resulting melt alloy was then cast into a copper mold to obtain a semi-finished product. The final target (2, as illustrated) with smooth surface and accurate dimensions was obtained with further machining.

Elements may be substituted. For example Manganese could be substituted for Aluminium, and a HEA thin film of $Co_{20}Cr_{20}Fe_{20}Ni_{20}Mn_{20}$ could be produced.

Figure 2:
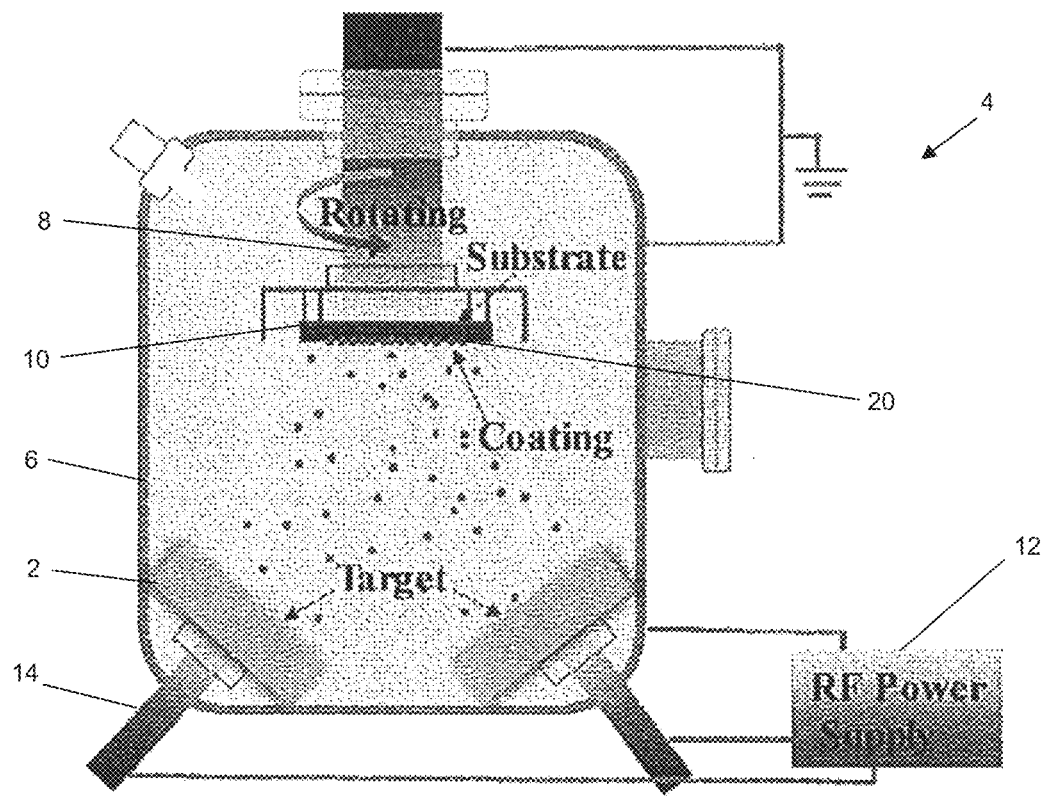
FIG. 2 is a schematic diagram of a magnetron sputtering system utilised in an embodiment of the invention.

With respect to FIG. 2, there is illustrated the magnetron sputtering system (4) comprising a vacuum chamber (6), a rotating holder (8) for a substrate (10), and a radio frequency power supply (12) connected to at least one target holder (14). Control means in the form of a computer (not shown) is also provided to control the power supply, rotation speed, gas flow rate, and/or the like. In use the substrate is rotated to ensure homogeneity of the thin film (20) coated thereon. When the magnetron sputtering system is not in use, it is recommended to put it into a standby vacuum to avoid contamination of the chamber.

Figure 3:
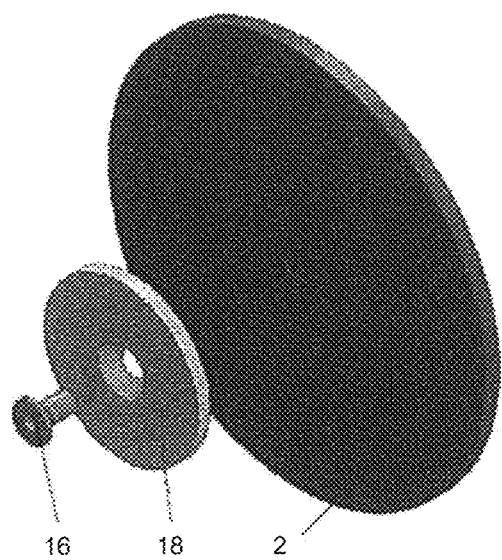
FIG. 3 illustrates a target holder utilised in an embodiment of the invention.

With regard to FIG. 3, it can be seen that the target (2) was screwed to the inside the vacuum chamber via a target holder comprising a screw (16) and a target keeper (18).

Silicon substrates were ultrasonically cleaned and rinsed with acetone, ethanol and deionized water for 15 min each before putting them in the vacuum chamber. High purity argon was added into the vacuum chamber when the base pressure was better than 1 μPa. The ignition argon flow was set to be around 20-22 standard cubic centimetres per minute (sccm). The targets were cleaned by argon ion bombardment for at least two minutes to remove any oxide or contaminants on the surface. The films were deposited by high vacuum radio frequency (RF) sputtering in an atmosphere of argon at room temperature, the argon flow rate being set to around 12 sccm and a specific working distance of around 80 mm. While the target may not react with the argon gas, the elements in the target may react with each other e.g. aluminium may react with nickel or iron. The rotation speed of the substrate was set to around 2 revolutions per minute to ensure a homogeneous deposition and cause the HEA film to have a nanocrystalline structure instead of a random film structure. Voltage and current were controlled to maintain power at around 500 W for the deposition. Various thickness thin films were obtained with different deposition time.

This method was used to obtain HEA thin films with a thickness of 550 μm, 2099 μm and 4122 μm using a deposition time of 45 mins, 90 mins and 180 mins respectively. Greater thicknesses can also be obtained by extending the deposition time.

Figure 4:
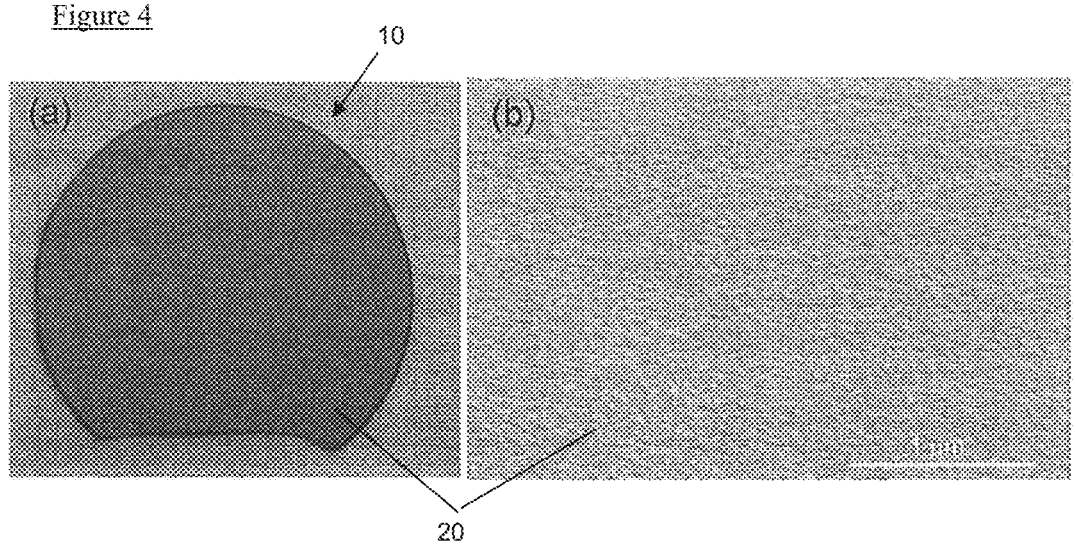
FIG. 4 illustrates the morphology of a thin film deposited according to an embodiment of the invention (a) on a silicon wafer; (b) at high magnification.

With respect to FIGS. 4a-b the morphology of the as-deposited thin film (20) on the silicon wafer (10) is illustrated. It can be seen that the thin film is very smooth and homogeneous, as shown in FIG. 4a. FIG. 4b shows the magnified image of the thin film. It can be seen that the thin film's surface is still a little rough by the magnetron sputtering method but compared with the thin film surface using a traditional method, the surface of the thin film by the current sputtering technique is much smoother, with the heights of the nano-scaled undulating nanostructures in all the thin films being less than 8 nm.

Figure 5:
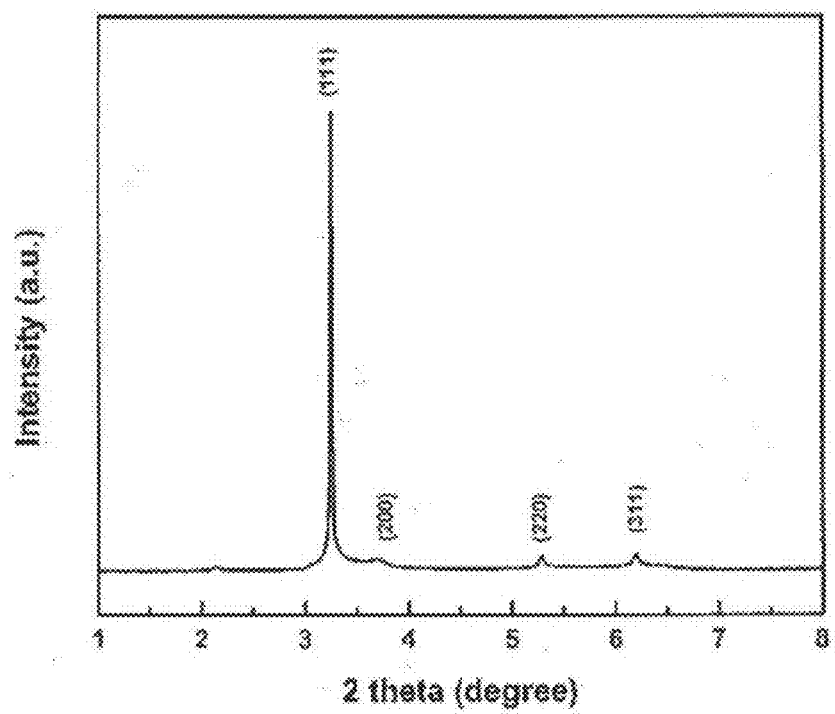
FIG. 5 is a graph illustrating the synchrotron radiation x-ray pattern of the thin film according to an embodiment of the invention.

With regard to FIG. 5, the synchrotron radiation X-ray analysis pattern was used to characterize the structure of the $CoCrFeNiAl_{0.3}$ thin film. It shows that the thin film is composed with a simple phase, and the structure was identified to be face centre cubic (fcc). Interestingly there is some texture in the thin film. It can be seen that when the alloy was sputtered on the silicon wafer, the thin film grows mainly along the (111) crystal direction.

Figure 6:
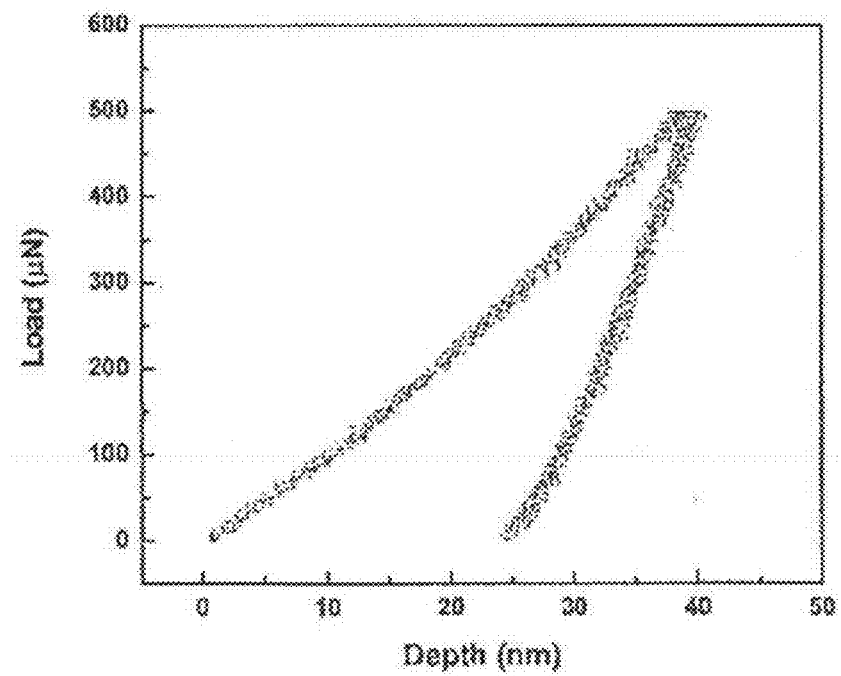
FIG. 6 is a load-depth curve of the thin film according to an embodiment of the invention.

With respect to FIG. 6, nano-indentation was used to test the mechanical properties of the $CoCrFeNiAl_{0.3}$ thin film with a Berkovich triangular pyramid indenter, and the load-depth curve of the as-deposited thin film is illustrated. The maximum load was set to be 500 μN, and a depth of about 40 nm was observed. Based on the load-depth curve, the elastic modulus of the thin film was calculated to be 190 GPa, and the hardness was about 11 GPa, which shows the superior surface mechanical properties of the HEA film as a result of its nanocrystalline structure.

As such, the invention can make full use of the advantages of the high entropy alloys, including high ductility, excellent wear and corrosion resistance, while reducing the production cost of the HEA raw materials for industrial applications. The high entropy alloy thin film can be coated on various industrial components, even with complicated geometries, by the magnetron sputtering to enhance the hardness, corrosion, wear resistance, and hence service life, of components such as cutting tools, bearings, molds and daily life decorations.

As indicated above, high entropy alloys have excellent mechanical properties, such as fracture resistance, high ductility, excellent corrosion and wear resistance. However the composition of multiple elements increases the cost of the high entropy alloys for industrial application. Compared with the conventional fabrication techniques for high entropy alloys, the magnetron sputtering provides the following advantages:

Firstly, magnetron sputtering is an effective way to fabricate a high entropy alloy thin film with a homogenous structure, making full use of advantages of high entropy alloys.

Secondly, this advanced technology is not only efficient, but also reduces the cost of the raw materials used for industrial application.

Finally, the high entropy alloy thin films can be coated on various components with complex structures and shapes easily.

Surface coating technology has been an advantageous technique with the development of modern industry, and has been widely used in our daily lives, such as industrial cutting tools, molds, and daily life decorations. It is reported that each year metal corrosion causes economic losses of about 700 billion US dollars. The high entropy alloys provide excellent corrosion resistance and good ductility. Coating the high entropy alloy thin film on industrial metals and tools not only enhances the mechanical properties of the industrial components, it is also an efficient way to reduce economic loss.

It will be appreciated by persons skilled in the art that numerous variations and/or modifications may be made to the present invention as shown in the specific embodiments without departing from the spirit or scope of the invention as broadly described. The present embodiments are, therefore, to be considered in all respects as illustrative and not restrictive.

It will also be appreciated by persons skilled in the art that the present invention may also include further additional modifications made to the method which does not affect the overall functioning of the method.

Any reference to prior art contained herein is not to be taken as an admission that the information is common general knowledge, unless otherwise indicated. It is to be understood that, if any prior art information is referred to herein, such reference does not constitute an admission that the information forms a part of the common general knowledge in the art, any other country.

The invention claimed is:

1. A method for preparing a high entropy alloy thin film coating comprising the steps of:
   preparing a melt alloy by arc melting Cobalt, Chromium, Iron, Nickel, and Aluminium provided in the atomic rations of 1:1:1:1:0.3;
   casting the melt alloy into a mold to form a target;
   placing the target inside a vacuum chamber of a magnetron sputtering system, the target being the only target placed inside the vacuum chamber;
   rotatably fixing a substrate inside the vacuum chamber, spaced apart from the target; and
   depositing a high entropy alloy thin film on the substrate by high vacuum radio frequency sputtering inside the vacuum chamber, wherein the high entropy alloy thin film has a face-centred cubic nanocrystalline structure.

2. The method according to claim 1 wherein the Cobalt Chromium, Iron, Nickel, and Aluminium have a high purity of >99.99%.

3. The method according to claim 1 wherein the mold is made of copper.

4. The method according to claim 1 wherein the target is machined to ensure it has a smooth surface and accurate dimensions.

5. The method according to claim 1 wherein the target is fixed to the vacuum chamber via a target holder.

6. The method according to claim 1 wherein the substrate is silicon.

7. The method according to claim 1 wherein the substrate is ultrasonically cleaned before putting it in the vacuum chamber.

8. The method according to claim 1 wherein the substrate is rinsed with acetone, ethanol and/or deionized water before putting it in the vacuum chamber.

9. The method according to claim 8 wherein the substrate is rinsed for around 15 minutes each with acetone, ethanol and/or deionized water.

10. The method according to claim 1 wherein argon is added into the vacuum chamber when the base pressure is less than 1 µPa.

11. The method according to claim 10 wherein the argon has a purity of at least 99.995%.

12. The method according to claim 10 wherein an ignition argon flow is set at around 20-22 cubic centimetres per minute.

13. The method according to claim 1 wherein the target is cleaned by argon ion bombardment for at least two minutes to remove any oxide or contaminants on the surface.

14. The method according to claim 1 wherein a radio frequency power supply is connected to at least one target holder inside the vacuum chamber.

15. The method according to claim 1 wherein the film is deposited on the substrate in an atmosphere of argon at room temperature.

16. The method according to claim 10 wherein an argon flow rate after ignition is around 12 cubic centimetres per minute.

17. The method according to claim 16 wherein a specific working distance between the substrate and the target is around 80 mm.

18. The method according to claim 1 wherein the rotation speed of the substrate is set at around 2 revolutions per minute to ensure homogeneous deposition.

19. The method according to claim 1 wherein power is set at around 500W for every deposition.

20. The method according to claim 1 wherein a film of around 500-1500 µm thickness is deposited for each hour.

21. A method for preparing a high entropy alloy thin film coating comprising the steps of:
   preparing a melt alloy by arc melting Cobalt, Chromium, Iron, Nickel and Aluminium, each having a purity of >99.99%, in the atomic ratios of 1:1:1:1:0.3;
   casting the melt alloy into a copper mold to form a target;
   fixing the target to a target holder inside a vacuum chamber of a magnetron sputtering system, the target being the only target placed inside the vacuum chamber;
   preparing a silicon substrate by ultrasonic cleaning, and rinsed with acetone, ethanol and deionized water for 15 minutes each;
   rotatably fixing the substrate inside the vacuum chamber, spaced apart from the target;

reducing the pressure inside the vacuum chamber to less than 1 µPa;
flowing argon into the vacuum chamber;
cleaning the target by argon ion bombardment for at least two minutes; and
depositing a high entropy alloy thin film on the substrate by high vacuum radio frequency sputtering inside the vacuum chamber, wherein the high entropy alloy thin film has a face-centred cubic nanocrystalline structure.

* * * * *